US006593634B2

(12) United States Patent
Ohmi et al.

(10) Patent No.: US 6,593,634 B2
(45) Date of Patent: Jul. 15, 2003

(54) SEMICONDUCTOR DEVICE AND METHOD OF MANUFACTURING THE SAME

(75) Inventors: Tadahiro Ohmi, Sendai (JP); Hiroyuki Shimada, Kofu (JP)

(73) Assignees: Seiko Epson Corporation, Tokyo (JP); Ohmi, Tadahiro, Sendai (JP)

( * ) Notice: Subject to any disclaimer, the term of this patent is extended or adjusted under 35 U.S.C. 154(b) by 0 days.

(21) Appl. No.: 09/834,992

(22) Filed: Apr. 12, 2001

(65) Prior Publication Data

US 2003/0052378 A1 Mar. 20, 2003

(30) Foreign Application Priority Data

Apr. 13, 2000 (JP) ......................................... 2000-112221

(51) Int. Cl.[7] .......................... H01L 29/76; H01L 29/94; H01L 31/062; H01L 31/113; H01L 31/119
(52) U.S. Cl. ........................ 257/412; 257/413; 257/379; 257/380; 257/761; 257/762
(58) Field of Search ................................ 257/412, 413, 257/353, 354, 761

(56) References Cited

U.S. PATENT DOCUMENTS

| | | | | | |
|---|---|---|---|---|---|
| 4,337,476 | A | * | 6/1982 | Fraser et al. | 357/67 |
| 5,140,403 | A | * | 8/1992 | Hikichi et al. | 357/67 |
| 5,625,217 | A | * | 4/1997 | Chau et al. | 257/412 |
| 5,849,623 | A | * | 12/1998 | Wojnarowski et al. | 438/382 |
| 6,018,182 | A | * | 1/2000 | Morosawa | 257/347 |
| 6,027,961 | A | * | 2/2000 | Maiti et al. | 438/199 |
| 6,225,168 | B1 | * | 5/2001 | Gardner et al. | 435/287 |
| 6,380,011 | B1 | * | 4/2002 | Yamazaki et al. | 438/163 |
| 6,407,430 | B1 | * | 6/2002 | Ohtani et al. | 257/350 |
| 2002/0008257 | A1 | * | 1/2002 | Barnak et al. | 257/262 |

FOREIGN PATENT DOCUMENTS

| | | |
|---|---|---|
| JP | 61-117868 | 6/1986 |
| JP | 61-127124 | 6/1986 |
| JP | 10-233505 | 9/1998 |
| JP | 11-168212 | 6/1999 |

OTHER PUBLICATIONS

U.S. patent application Ser. No. 09/834,993, et al., filed Apr. 12, 2001.
Shimada, et al.—"Low Resisitivity PVD TaNx/Ta/TaNx Stacked Metal Gate CMOS Technology Using Self–Grown bcc–Phased Tantalum on TaNx Buffer Layer" Aug. 31, 2000 / Extended Abstract of the 2000 International Conference on Solid State Device and Materials, Sendai, 2000, pp. 460–461.
Hwang, et al. Novel Polysilicon/TiN Stacked–Gate Structure for Fully–Depleted SOI/CMOS, IEDM Technical Digest 1992, pp. 345–348.
Ushiki, et al. Reliable Tantalum Gate Fully–Depleted SOI MOSFET's with 0.15μm Gate Length by Low–Temperature Processing below 500° C., IEDM Technical Digest 1996, pp. 117–120.

* cited by examiner

Primary Examiner—Allan R. Wilson
Assistant Examiner—Jesse A Fenty
(74) Attorney, Agent, or Firm—Hogan & Hartson, LLP

(57) ABSTRACT

A semiconductor device includes an NMOSFET and a PMOSFET. Each MOSFET includes first and second impurity diffusion layers for forming a source region and a drain region which are formed in a silicon layer of an SOI substrate or the like, a channel region formed between the first and second impurity diffusion layers, a gate insulation layer at least formed on the channel region, and a gate electrode formed on the gate insulation layer. The gate electrode includes a tantalum nitride layer in a region in contact with at least the gate insulation layer. The semiconductor device exhibits high current drive capability and can be manufactured at high yield.

16 Claims, 10 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same. More particularly, the present invention relates to an insulated gate field effect transistor characterized by its gate electrode, and to a method of manufacturing the same.

2. Description of the Related Art

In insulated gate field effect transistors used for current semiconductor integrated circuits, a polycrystalline silicon layer doped with high concentration of impurities is generally used as a gate electrode in order to decrease the resistance. In a semiconductor process used for CMOS circuits (Complimentary MOSFET circuits), N-type polycrystalline silicon and P-type polycrystalline silicon are respectively used for an N-channel MOSFET (NMOSFET) and a P-channel MOSFET (PMOSFET) as gate electrode materials for balancing the characteristics. Generally, a refractory metal silicide layer is formed in the upper layer of the gate electrode in order to further decrease the resistance.

However, depletion occurs in the polysilicon layer of the gate electrode although the polysilicon layer is doped with high concentration of impurities. Occurrence of depletion is equivalent to the condition in which a capacitance is inserted into the gate electrode in series, thereby decreasing an effective electric field applied to a channel. As a result, the current drive capability of the MOSFET decreases. It is difficult to decrease the resistance of the entire gate electrode to 5Ω/□ or less even if a silicide layer is laminated on the polycrystalline silicon layer. In the case of miniaturizing the device to the 0.1 micron generation, since the thickness of the gate electrode must be reduced, the gate electrode is required to have a specific resistance of about 30 $\mu\Omega$·cm or less.

The work functions of the N-type polycrystalline silicon layer and the P-type polycrystalline silicon layer, which are directly in contact with the gate insulation layer, are respectively 4.15 eV and 5.25 eV. The work functions of these layers significantly differ from the center of the bandgap of silicon (4.61 eV). Such a large difference results in an increase in the absolute value of a flat band voltage $V_{FB}$ in a MOS capacitor formed of a metal-insulation layer-semiconductor (signs differ between NMOSFET and PMOSFET). Therefore, in such MOSFETs, an optimum value of the impurity concentration in the channel must be shifted to the high concentration side in order to control a threshold value $V_{TH}$. The channel with high-concentration impurities is significantly influenced by carrier scattering due to impurities. As a result, carrier mobility in the channel decreases. This means a decrease in the current drive capability of the MOSFET, thereby significantly affecting the response characteristics of the circuit.

In order to solve these problems, low-resistance gate electrode materials which do not cause gate depletion to occur and have various work functions have been proposed. For example, Jeong-Mo Hwang, et al. (IEDM Technical Digest 1992, page 345) discloses a structure using a titanium nitride (TiN) layer. Ushiki, et al. (IEDM Technical Digest 1996, page 117) discloses a structure using a beta-tantalum (β-Ta) layer.

The following is pointed out for the gate electrode having a TiN layer formed on a gate insulation layer used in the N-type or P-type MOSFET. Since the TiN layer has a relatively high specific resistance of about 200 $\mu\Omega$·cm, a metal (tungsten, for example) layer is laminated on the TiN layer in order to decrease resistance of the gate electrode. The work function of the TiN layer (4.7 to 4.8 eV) is close to the center of the bandgap of silicon (4.61 eV), as reported by Jeong-Mo Hwang, et al., whereby a significant effect is expected in view of the threshold value control.

However, according to this configuration example, since the TiN layer and the tungsten layer are dissolved in a chemical solution such as a hydrogen peroxide aqueous solution and sulfuric acid, it is very difficult to clean the gate electrode layer after etching. Therefore, devices having this structure cannot be manufactured at high yield.

The following is pointed out for the gate electrode having a tantalum layer formed on the gate insulation layer used in the N-type or P-type MOSFET. According to this configuration example, only a beta-tantalum layer exhibiting high resistance as a metal (specific resistance: about 160 $\mu\Omega$·cm) can be deposited as the tantalum layer, whereby the resistance of the gate electrode relatively increases. Moreover, since the work function of the beta-tantalum layer significantly differs from the center of the bandgap of silicon, the threshold value is shifted to the low threshold side, thereby resulting in an imbalance threshold between the NMOSFET and the PMOSFET.

SUMMARY OF THE INVENTION

An objective of the present invention is to provide a semiconductor device which exhibits high current drive capability and can be manufactured at high yield, and a method of manufacturing the same.

A semiconductor device according to one aspect of the present invention comprises:

first and second impurity diffusion layers forming a source region and a drain region which are formed in a semiconductor layer;

a channel region formed between the first and second impurity diffusion layers;

a gate insulation layer formed at least on the channel region; and a gate electrode formed on the gate insulation layer, wherein the gate electrode includes a tantalum nitride layer formed in a region in contact with at least the gate insulation layer.

The semiconductor device according to this aspect of the present invention has the following actions and effects.

(1) The gate electrode includes the tantalum nitride layer formed so as to be in contact with the gate insulation layer. The work function of the tantalum nitride layer is approximately 4.5 eV, which is extremely close to the center of the bandgap of silicon. As a result, the absolute value of a flat band voltage in a capacitor formed of metal-insulation layer-silicon can be decreased. This eliminates the need for increasing the concentration of impurities doped into the channel region in order to obtain an appropriate threshold value. Therefore, a decrease in carrier mobility can be prevented, whereby a insulated gate field effect transistor exhibiting high current drive capability can be obtained at high yield.

(2) As described in the above (1), the work function of the tantalum nitride layer is extremely close to the center of the bandgap of silicon. Because of this, the difference in the absolute values of the flat band voltages between an N-channel insulated gate field effect transistor and a P-channel insulated gate field effect transistor can be significantly decreased in a capacitor formed of metal-insulation layer-silicon, although the same type of electrode is used for the both transistors. As a result, in a complementary semiconductor device including both an N-channel insulated gate field effect transistor and a P-channel insulated gate field effect transistor, the threshold balance between these transistors can be accurately and easily controlled. Moreover, use of the same type of the electrode reduces the fabrication steps in comparison with above-described conventional polysilicon gates. Furthermore, in the case of a complementary semiconductor device using a fully depleted silicon on insulator (SOI) structure or silicon on nothing (SON) structure, the absolute value of the threshold voltage can be decreased while preventing punch-through from occurring. This leads to advantages in miniaturization and low-voltage drive.

(3) The gate electrode includes at least the tantalum nitride layer, and the polysilicon layer is not in contact with the gate electrode. Therefore, depletion does not occur in the gate electrode. As a result, the gate electrode can prevent effective electric field applied to the channel region from decreasing in comparison with the case of using a polysilicon layer. This also prevents a decrease in current drive capability.

(4) The tantalum nitride layer forming the gate electrode exhibits higher chemical stability in comparison with a titanium nitride layer and the like. For example, the tantalum nitride layer exhibits excellent resistance to a chemical solution used to clean the gate electrode. As a result, devices can be manufactured at high yield.

This aspect of the present invention has the following features. These features also apply to a complementary semiconductor device and a method of manufacturing a semiconductor device described later.

(A) A nitrogen/tantalum ratio (x) shown by $TaN_x$ in the tantalum nitride layer may be 0.25 to 1.0 in view of conductivity and work function. In particular, the nitrogen/tantalum ratio (x) shown by $TaN_x$ in the tantalum nitride layer may be about 0.5.

(B) The gate electrode may be formed of a single layer formed of a tantalum nitride layer. In this case, the tantalum nitride layer may have a thickness of 1 nm to 300 nm in view of conductivity of the gate electrode.

(C) The gate electrode may have a multilayer structure including the tantalum nitride layer and a metal layer. As examples of the metal used for the metal layer, refractory metals such as tantalum, tungsten, molybdenum, the chromium, niobium, and vanadium can be given.

(D) The gate electrode may include a cap layer formed in the uppermost layer. The cap layer may be formed of at least one material selected from $TaN_x$, $TaSi_xN_y$, $TiN_x$, $TiAl_xN_y$, Si, and silicide of a transition metal.

(E) Silicide layers may be formed on the exposed areas of the first and second impurity diffusion layers and on the upper side of the gate electrode. The presence of such silicide layers increases conductivity of the first and second impurity diffusion layers and the gate electrode.

(F) The semiconductor layer may have an SOI structure or SON structure. And the semiconductor layer may be a silicon layer containing impurities at a concentration of $10^{17}$ $cm^{-3}$ or less and having a thickness one-third a gate length or less, which is formed on a bulk semiconductor substrate containing impurities at a concentration of more than $10^{17}$ $cm^{-3}$.

The present invention can be suitably applied to a complementary semiconductor device, as described above.

Specifically, a complementary semiconductor device according to another aspect of the present invention comprises an N-channel insulated gate field effect transistor and a P-channel insulated gate field effect transistor, wherein each of the N-channel insulated gate field effect transistor and the P-channel insulated gate field effect transistor includes:

first and second impurity diffusion layers for forming a source region and a drain region which are formed in a semiconductor layer;

a channel region formed between the first and second impurity diffusion layers;

a gate insulation layer formed on the channel region; and a gate electrode formed on the gate insulation layer, and wherein the gate electrode includes a tantalum nitride layer formed in a region in contact with at least the gate insulation layer.

According to this complementary semiconductor device, since the work function of the tantalum nitride layer is extremely close to the center of the bandgap of silicon, as described above, the absolute value of the flat band voltage can be decreased. This eliminates the need for increasing the concentration of impurities doped into the channel region in order to obtain an appropriate threshold value. Therefore, a decrease in carrier mobility can be prevented, whereby a insulated gate field effect transistor exhibiting high current drive capability can be obtained at high yield. Moreover, the threshold balance between the N-channel insulated gate field effect transistor and the P-channel insulated gate field effect transistor can be accurately and easily controlled although the same type of electrode is used for the both transistors. Furthermore, in the case of a complementary semiconductor device using a fully depleted SOI structure or SON structure, the absolute value of the threshold voltage can be decreased while preventing punch-through from occurring. This ensures the achievement of miniaturization and low-voltage drive.

A method of manufacturing a semiconductor device according to a further aspect of the present invention comprises the following steps (a) to (c):

(a) a step of forming a gate insulation layer on a semiconductor layer;

(b) a step of forming a gate electrode on the gate insulation layer, and forming a tantalum nitride layer in a region in contact with at least the gate insulation layer; and (c) a step of forming first and second impurity diffusion layers forming a source region and a drain region by introducing impurities into the semiconductor layer.

The method of manufacturing a semiconductor device according to this aspect of the present invention has the following features. These features also apply to a method of manufacturing a complementary semiconductor device described later.

(A) In the step (c), the first and second impurity diffusion layers may be formed in a self-alignment manner using the gate electrode as a mask (B) The method may comprise a step (e) of forming a side-wall spacer on a side of the gate electrode after the step (c).

(C) Silicide layers may be formed on exposed areas of the first and second impurity diffusion layers after the step (e).

A method of manufacturing a complementary semiconductor device including an N-channel insulated gate field effect transistor and a P-channel insulated gate field effect transistor according to a still further aspect of the present invention comprises the following steps (a) to (c):

(a) a step of forming a gate insulation layer on a semiconductor layer;

(b) a step of forming a gate electrode on the gate insulation layer, and forming a tantalum nitride layer in a region in contact with at least the gate insulation layer; and (c) a step of introducing impurities into the semiconductor layer to form a source region and a drain region, comprising forming N-type first and second impurity diffusion layers for the N-channel insulated gate field effect transistor and forming P-type first and second impurity diffusion layers for the P-channel insulated gate field effect transistor.

DETAILED DESCRIPTION OF EMBODIMENT OF THE INVENTION

Embodiments of the present invention are described below with reference to the drawings.

First Embodiment

Device

Figure 1:
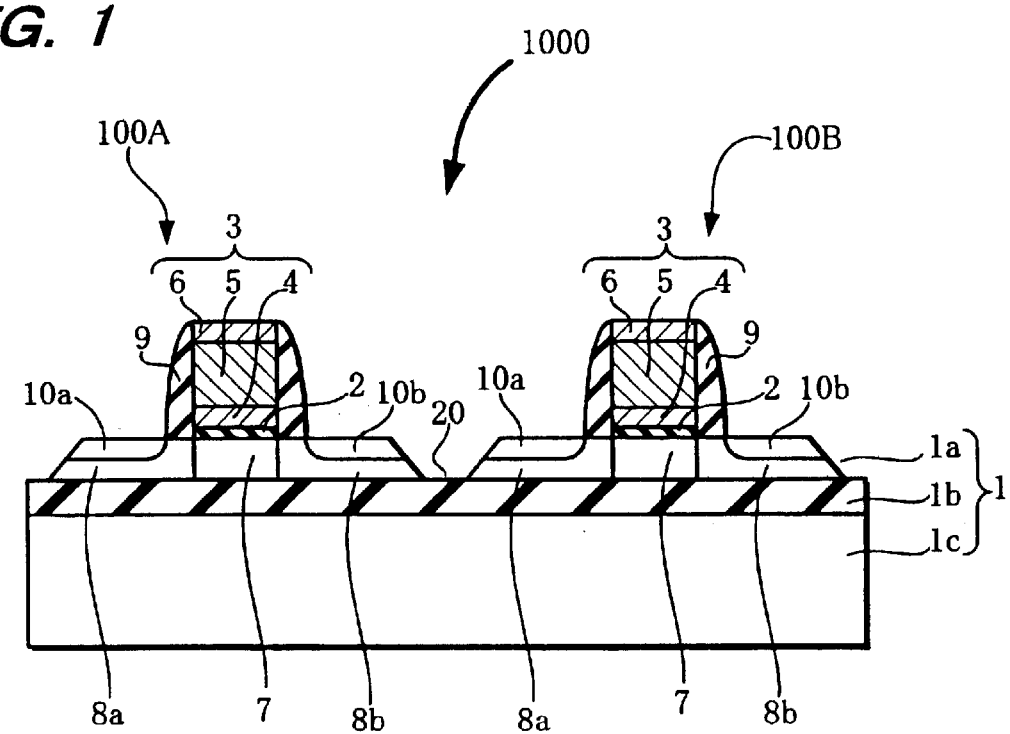
FIG. 1 is a cross-sectional view schematically showing a semiconductor device according to a first embodiment of the present invention.

FIG. 1 is a cross-sectional view schematically showing a semiconductor device 1000 according to a first embodiment of the present invention. The semiconductor device 1000, which is a CMOS semiconductor device, includes an N-channel insulated gate field effect transistor (NMOSFET) 100A and a P-channel insulated gate field effect transistor (PMOSFET) 100B. The NMOSFET 100A and the PMOSFET 100B are formed on a silicon on insulator (SOI) substrate 1. The SOI substrate 1 is formed of an insulation layer (silicon oxide layer) 1b and a low-concentration P-type silicon layer 1a laminated on a support substrate 1c. The NMOSFET 100A and the PMOSFET 100B are electrically isolated by a trench 20 formed in the P-type silicon layer 1a of the SOI substrate 1.

Each of the MOSFETs 100A and 100B has a structure in which a stacked gate electrode 3 is formed on the P-type silicon layer 1a through a gate insulation layer 2. Each of the stacked gate electrode 3 is formed of a tantalum nitride layer 4, a body-centered cubic tantalum layer 5 or a layer of a refractory metal such as tantalum having other crystal structure, tungsten, molybdenum, chrome, niobium, or vanadium, and a tantalum nitride layer 6 as a cap layer laminated in that order. Channel regions 7 are formed right under the gate insulation layers 2. Impurity diffusion regions 8a and 8b for forming source/drain regions (source region or drain region) are formed on both sides of the channel regions 7.

The impurity diffusion regions 8a and 8b of the NMOSFET 100A are N-type. The impurity diffusion regions 8a and 8b of the PMOSFET 100B are P-type. Silicide layers 10a and 10b are respectively formed on the impurity diffusion regions 8a and 8b.

In the present embodiment, the tantalum nitride layers 4 are formed in a region in contact with at least the gate insulation layers 2. The nitrogen/tantalum ratio (x) of the tantalum nitride layers 4 shown by $TaN_x$ can be 0.25 to 1.0 in view of conductivity, threshold characteristics, and the like. In the case where the gate electrodes 3 have a stacked structure, the nitrogen/tantalum ratio (x) of the tantalum nitride layers 4 shown by $TaN_x$ can be about 0.5 in view of the crystal growth of the tantalum layers 5.

Since the gate electrodes 3 include the tantalum nitride layer 6 as a cap layer formed of an oxidation-resistant material in the uppermost layer, the tantalum layer 5 can be prevented from being damaged by oxidation in an oxidation process to be carried out later. Such a cap layer may be formed using at least one material selected from $TaN_x$, $TaSi_xN_y$, $TiN_x$, $TiAl_xN_y$, Si, silicide of a transition metal, and the like.

The semiconductor device according to the present embodiment mainly has the following actions and effects.

(1) The gate electrode 3 includes the tantalum nitride layer 4 formed so as to be in contact with the gate insulation layer 2. The work function of the tantalum nitride layer 4 is approximately 4.5 eV, which is extremely close to the center of the bandgap of silicon. As a result, the absolute value of a flat band voltage in a capacitor consisting of metal-insulation layer-silicon can be decreased. This eliminates the need for increasing the concentration of impurities doped into the channel region in order to obtain an appropriate threshold value. Therefore, a decrease in carrier mobility can be prevented, whereby an MOSFET exhibiting high current drive capability can be obtained at high yield.

"(2) The work function of the tantalum nitride layer 4 is extremely close to the center of the bandgap of silicon, as described in the above (1). Because of this, the difference in the absolute values of the flat band voltage between the NMOSFET 100A and the PMOSFET 100B can be significantly decreased although the same type of electrode is used. As a result, the threshold values of the NMOSFET and the PMOSFET in a CMOS circuit can be balanced. Moreover, the fully depleted SOI structure can be used to achieve miniaturization and drive low voltage."

(3) The gate electrode 3 is formed of the tantalum nitride layer 4, the tantalum layer 5 or the above other refractory metal layer, and the tantalum nitride layer 6. The polysilicon layer is not in contact with the gate electrode. Therefore, depletion does not occur in the gate electrode. As a result, the gate electrode 3 can provide a lesser decrease in the effective electric field applied to the channel region in comparison with the case of using a polysilicon layer. This also prevents current drive capability from decreasing.

(4) The tantalum nitride layer 4 and the tantalum layer 5 or the above other refractory metal layer of the gate electrode 3 exhibit higher chemical stability in comparison with a titanium nitride layer and the like. For example, the tantalum nitride layer 4 and the tantalum layer 5 exhibit excellent resistance to a chemical solution used to clean the gate electrode. As a result, devices can be manufactured at high yield.

(5) Since the tantalum layer 5 of the gate electrode 3 is formed of body-centered cubic tantalum, the tantalum layer 5 exhibits higher conductivity in comparison with beta-tantalum. Specifically, body-centered cubic tantalum can decrease the resistance of the gate electrode 3 to about one-tenth of that of the case of using beta-tantalum.

The details of the formation of body-centered cubic tantalum, of which the formation has been difficult, and device characteristic tests of the present invention are described later.

Manufacture Method

The method of manufacturing the semiconductor device 1000 is described below with reference to FIGS. 2 to 5.

Figure 2:
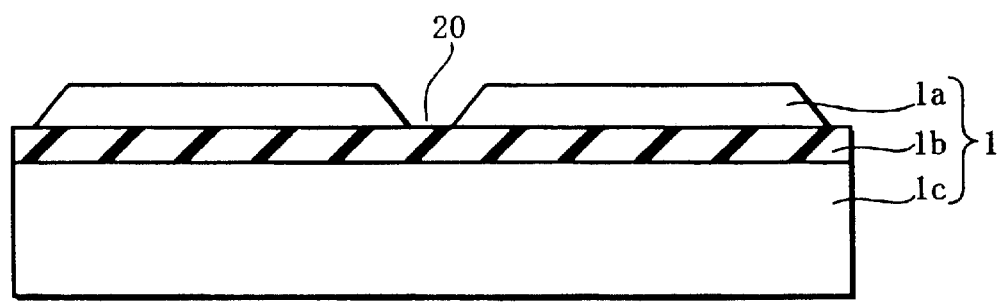
FIG. 2 is a cross-sectional view showing a method of manufacturing the semiconductor device according to the first embodiment of the present invention.

(a) A P-type SOI silicon layer 1a (thickness: 50 nm, specific resistance: 14 to 26 Ω·cm, surface orientation (100)) is patterned, thereby forming the trench 20 for isolating the elements, as shown in FIG. 2.

Figure 3:
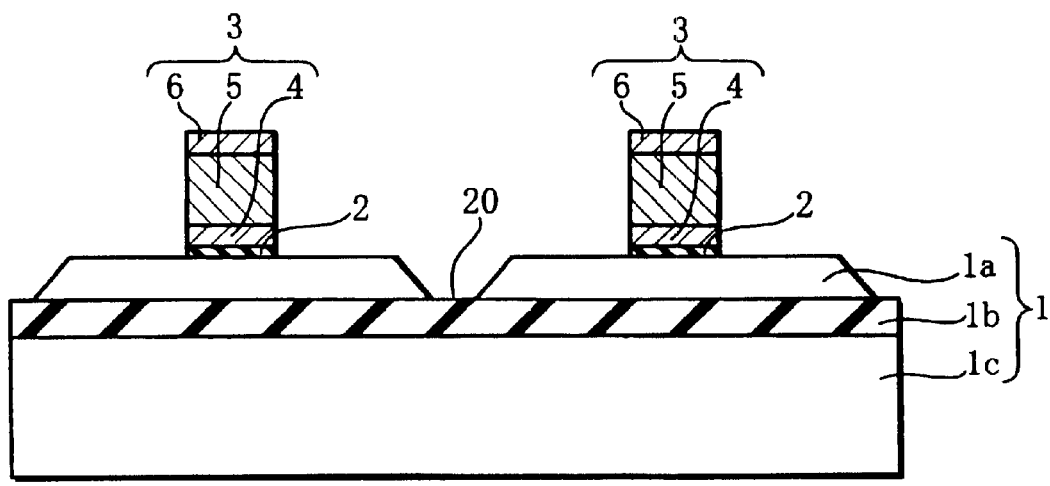
FIG. 3 is a cross-sectional view showing the method of manufacturing the semiconductor device according to the first embodiment of the present invention.

(b) The gate insulation layers 2 formed of a silicon oxide layer with a thickness of about 3 nm are formed using a thermal oxidation process, as shown in FIG. 3.

The tantalum nitride layer 4, the body-centered cubic tantalum layer 5 or the above other refractory metal layer, and the tantalum nitride layer 6 as a cap layer are deposited in that order by sputtering using xenon gas.

Sputtering using xenon with a mass greater than that of conventionally used argon ensures that energy is applied only to the surface of the layer during deposition without causing defects or damage to occur in the underlying gate insulation layers 2 and the silicon layer 1a. Specifically, xenon has an atomic radius of 0.217 nm which is greater than that of argon (0.188 nm). Therefore, xenon is introduced into the layer to a small extent, whereby energy can be applied efficiently only to the surface of the layer. The atomic weight of argon is 39.95, which is close to the atomic weight of silicon. The atomic weight of xenon is 131.3, which is greater than the atomic weight of argon. Because of this, xenon exhibits lower energy/momentum transfer efficiency to the layer in comparison with argon, thereby causing no, or only a small amount of, defects or damage to occur. Therefore, xenon ensures that the tantalum nitride layer 4 and the tantalum layer 5 can be formed without causing defects or damage to occur in the gate insulation layer in comparison with argon. This tendency also applies to krypton.

In the present embodiment, the body-centered cubic tantalum layer 5 with low resistance can be heteroepitaxially grown on the tantalum nitride layer 4 by lattice matching by employing the above deposition method. The tantalum nitride layer 6 in the upper layer functions as a cap layer for preventing oxidation to occur in a process after etching the gate electrode.

The tantalum nitride layer 4, the body-centered cubic tantalum layer 5 or the above other refractory metal layer, and the tantalum nitride layer 6 can be formed continuously without being exposed to air. If the film is exposed to air during deposition, moisture may adhere to the film or oxide may be formed on the surface of the film.

The gate electrode is then patterned using a lithographic technique and a dry etching technique.

Figure 4:
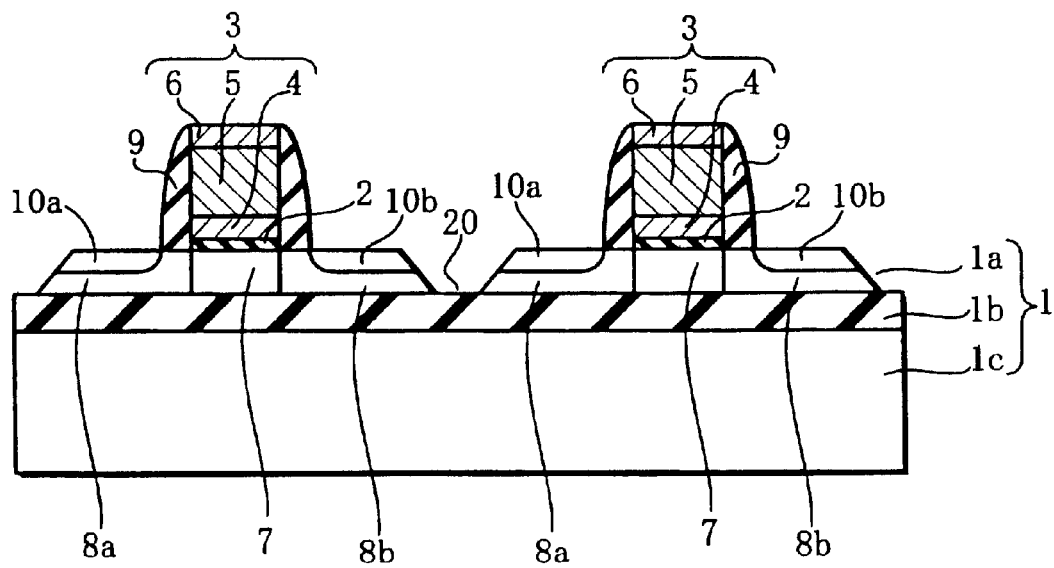
FIG. 4 is a cross-sectional view showing the method of manufacturing the semiconductor device according to the first embodiment of the present invention.
Figure 5:
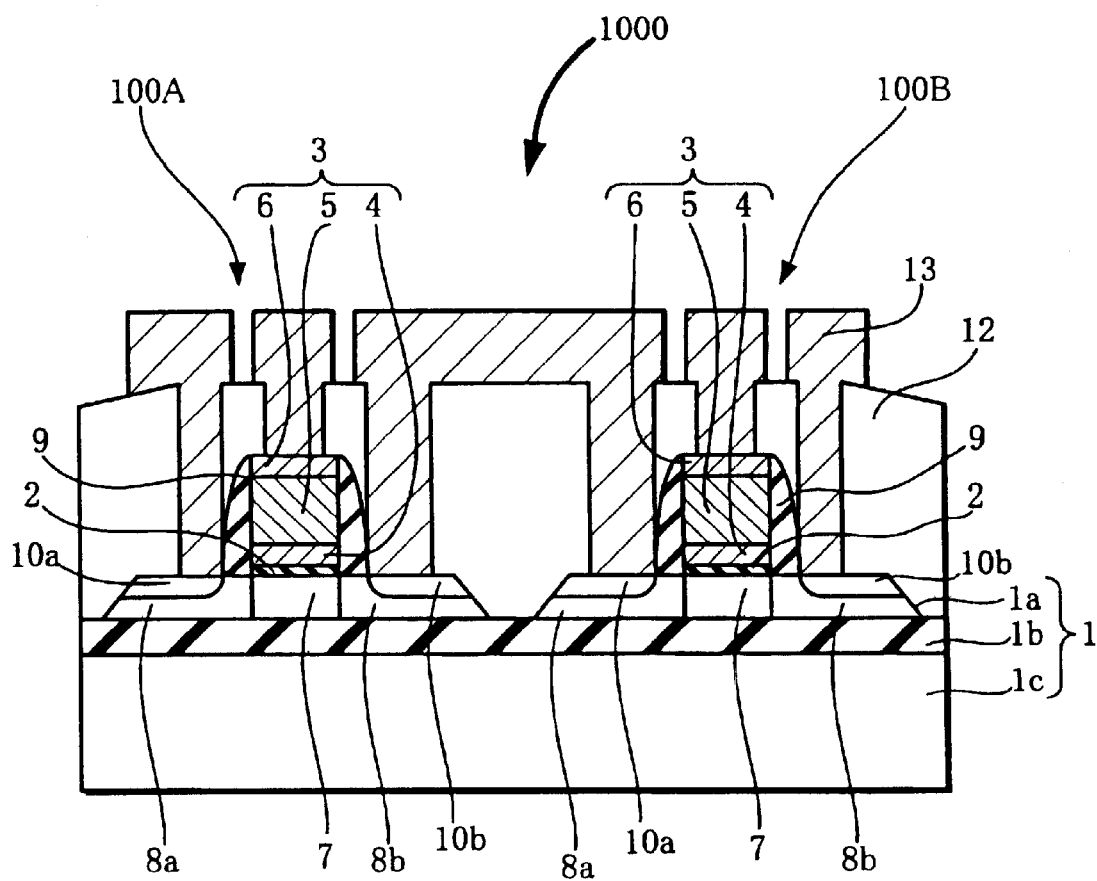
FIG. 5 is a cross-sectional view showing the method of manufacturing the semiconductor device according to the first embodiment of the present invention.

(c) An arsenic ion ($As^+$) and a boron difluoride ion ($BF_2^+$) are respectively implanted into the NMOSFET and the PMOSFET at a concentration of $10^{20}$ cm$^{-3}$ or more using the gate electrode 3 as a mask, as shown in FIG. 4. When forming the impurity diffusion layers of the NMOSFET and the PMOSFET, a mask layer (not shown) such as a resist layer is formed in a predetermined region so that an impurity ion with a reversed polarity is not doped.

Impurity diffusion layers 8a and 8b can be formed in a self-alignment manner by low-temperature annealing at 700° C. or less, for example 450° C. to 550° C.

Then, a silicon oxide layer is deposited over the entire surface of the SOI substrate 1 on which the gate electrodes 3 are formed using a CVD (Chemical Vapor Deposition) process. The silicon oxide layer is etched back using a dry etching process, thereby forming side-wall spacers 9.

A transition metal layer such as an Ni layer is deposited using a sputtering process and then annealed, thereby forming nickel silicide layers 10a and 10b on the exposed area of the impurity diffusion layers 8a and 8b. As metal such as titanium (Ti) or cobalt (Co) may be used as the transition metal without specific limitations insofar as the silicide can be formed. Unreacted transition metal layers on the side-wall spacers 9 are removed using an acid such as sulfuric acid, thereby forming the silicide layers 10a and 10b in a self-alignment manner.

(d) An interlayer dielectric 12 and a wiring layer 13 are then formed by a wiring step using conventional CMOS process technology to obtain the semiconductor device 1000.

According to this manufacture method, the body-centered cubic tantalum layer 5 can be heteroepitaxially formed on the tantalum nitride layer 4 using sputtering by forming the tantalum nitride layer 4 in a region in contact with at least the gate insulation layer 2. In addition, the above other high-melting-point metal layer may be formed instead of the body-centered cubic tantalum layer 5.

Crystal Structure and Characteristic Test

The crystal structure of the semiconductor device according to the present invention, specifically, heteroepitaxial technology of the gate electrodes by lattice matching is described below. Characteristic tests determined for the semiconductor device according to the present invention and a semiconductor device for comparison are also described below. Samples used for the analysis of the crystal structure and for the characteristic tests are as follows.

Sample of the present invention

A CMOS semiconductor device is formed on the SOI substrate 1 of which the thickness of the P-type silicon layer 1a is 57 nm. The gate insulation layer 2 of the CMOS semiconductor device is formed of a silicon oxide layer with a thickness of 3.8 nm or 5.5 nm. The gate electrode 3 includes the tantalum nitride layer 4 with a thickness of 5 nm formed on the gate insulation layer 2 and the body-centered cubic tantalum layer 5 with a thickness of 158 nm. As a sample for determining capacitance of the MOS, a CMOS semiconductor device in which a silicon oxide layer with a thickness of 11.5 nm is formed on a bulk layer formed of P-type silicon instead of the gate insulation layer, and a tantalum nitride layer and a body-centered cubic tantalum layer each having the same thickness as that of the above gate electrode was used.

Sample for Comparison

The sample for comparison has a structure similar to that of the sample of the present invention except that the gate electrode includes a beta-tantalum layer instead of the tantalum nitride layer.

(1) Crystal Structure

Figure 6:
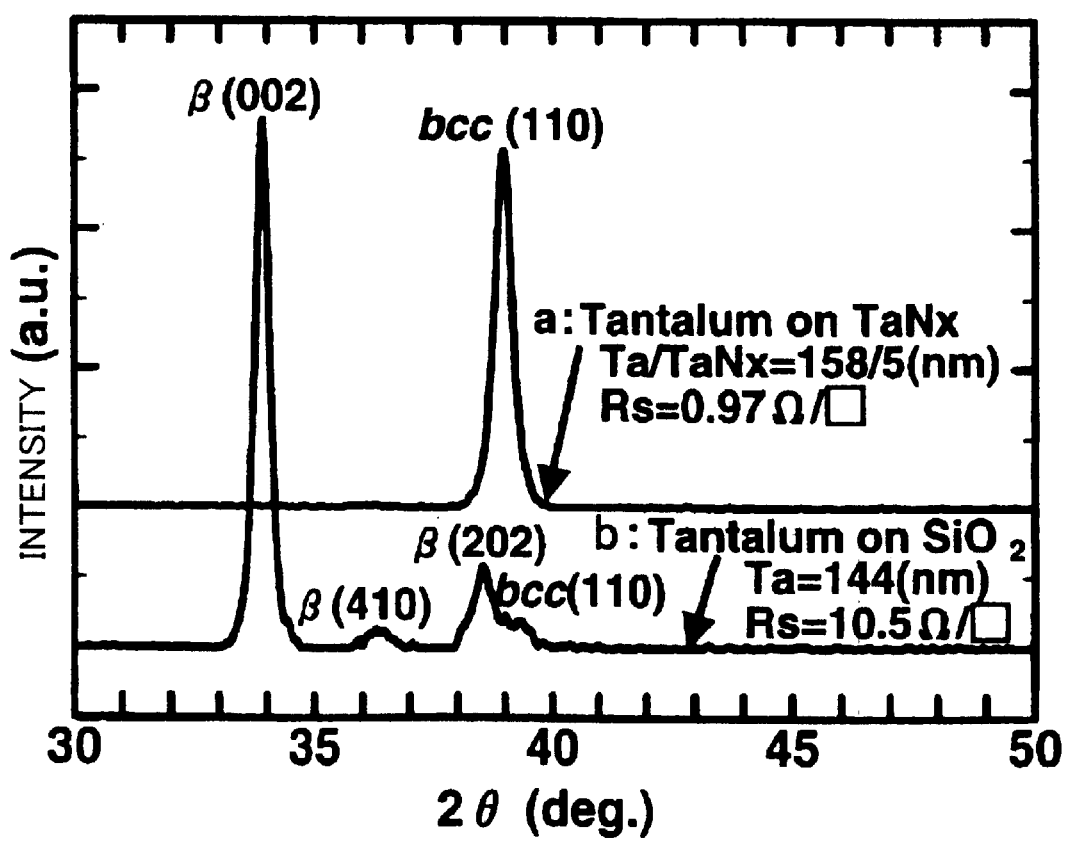
FIG. 6 is a view showing an X-ray diffraction spectrum of a gate structure determined for a sample of the present invention and a sample for comparison.

FIG. 6 shows diffraction peaks of the tantalum layers of the sample of the present invention and the sample for comparison using an X-ray diffraction method. In FIG. 6, the horizontal axis shows diffraction angle and the vertical axis shows intensity. In FIG. 6, a line indicated by a symbol "a" shows the results for the sample of the present invention. A line indicated by a symbol "b" shows the results for the sample for comparison.

As is clear from FIG. 6, high-resistance beta-tantalum is grown on the $SiO_2$ layer (gate insulation layer) in the sample for the comparison. On the contrary, body-centered cubic (bcc) alpha-tantalum with low resistance is grown on the tantalum nitride layer in the sample of the present invention, on which beta-tantalum is not grown.

This gives rise to the assumption that the growth of the tantalum layer is influenced by the underlying layer. Table 1 shows the lattice constant (d), surface orientation (hkl), and diffraction angle (2θ) of tantalum and tantalum nitride. As is clear from Table 1, the surface (110) of body-centered cubic alpha-tantalum (bcc-Ta) and the surface (101) of ditantalum nitride ($TaN_{0.5}$) have very close lattice constants. Mismatch of the lattice constants between these surfaces is only about 0.68%.

TABLE 1

| | (hkl) | d (nm) | 2θ (deg) |
|---|---|---|---|
| β-Ta | (002) | 0.2658 | 33.69 |
| β-Ta | (410) | 0.2474 | 33.28 |
| β-Ta | (202) | 0.2354 | 38.20 |
| bcc-Ta | (110) | 0.2338 | 38.47 |
| Ta$_2$N | (101) | 0.2323 | 38.73 |
| TaN | (200) | 0.2169 | 41.60 |

Figure 7:
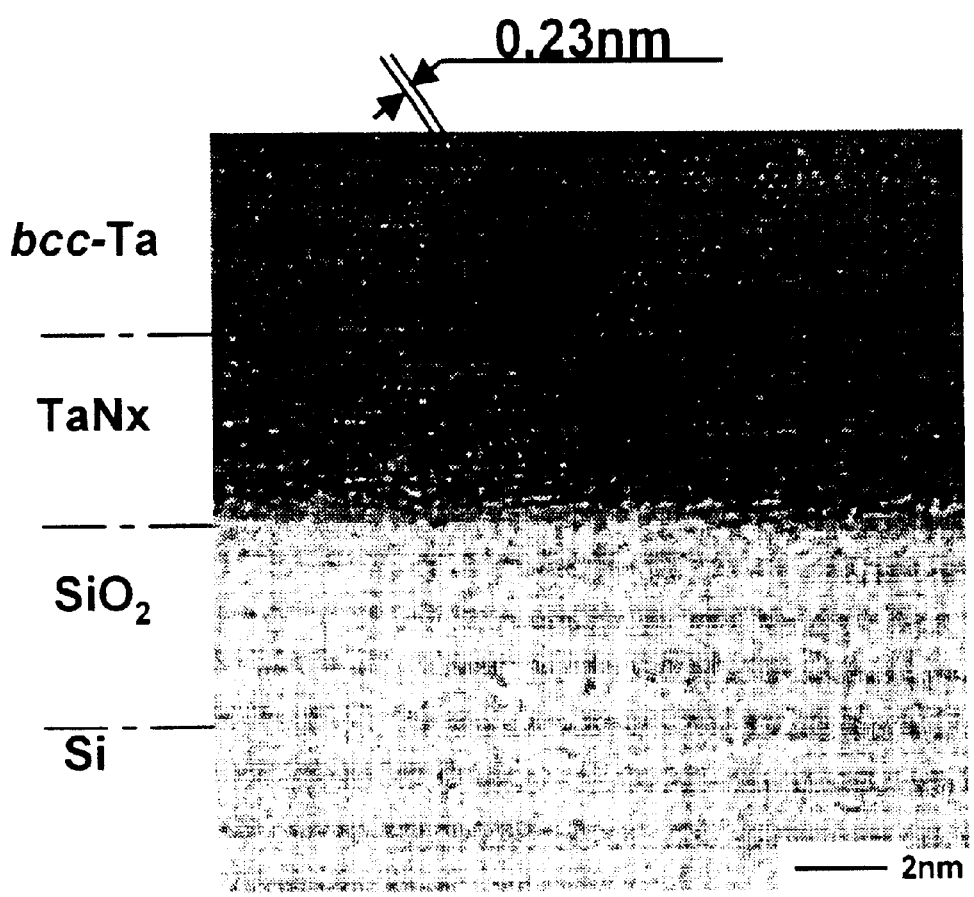
FIG. 7 is an electron microscope photograph showing a cross-sectional structure of the sample of the present invention.

As a result of cross-sectional observation of the interface between tantalum nitride and alpha-tantalum deposited thereon using a transmission electron microscope, the lattice constants of both layers were found to be about 0.23 nm, which is approximately the same as the values shown in Table 1. FIG. 7 shows a cross-sectional photograph taken using a transmission electron microscope.

As described above, body-centered cubic alpha-tantalum (bcc-Ta) is heteroepitaxially grown on ditantalum nitride ($TaN_{0.5}$) by lattice matching in the sample of the present invention. On the contrary, beta-tantalum layer is formed on the gate insulation layer (silicon oxide layer) in the sample for comparison.

(2) Quasi-Static C-V Characteristics

Figure 8:
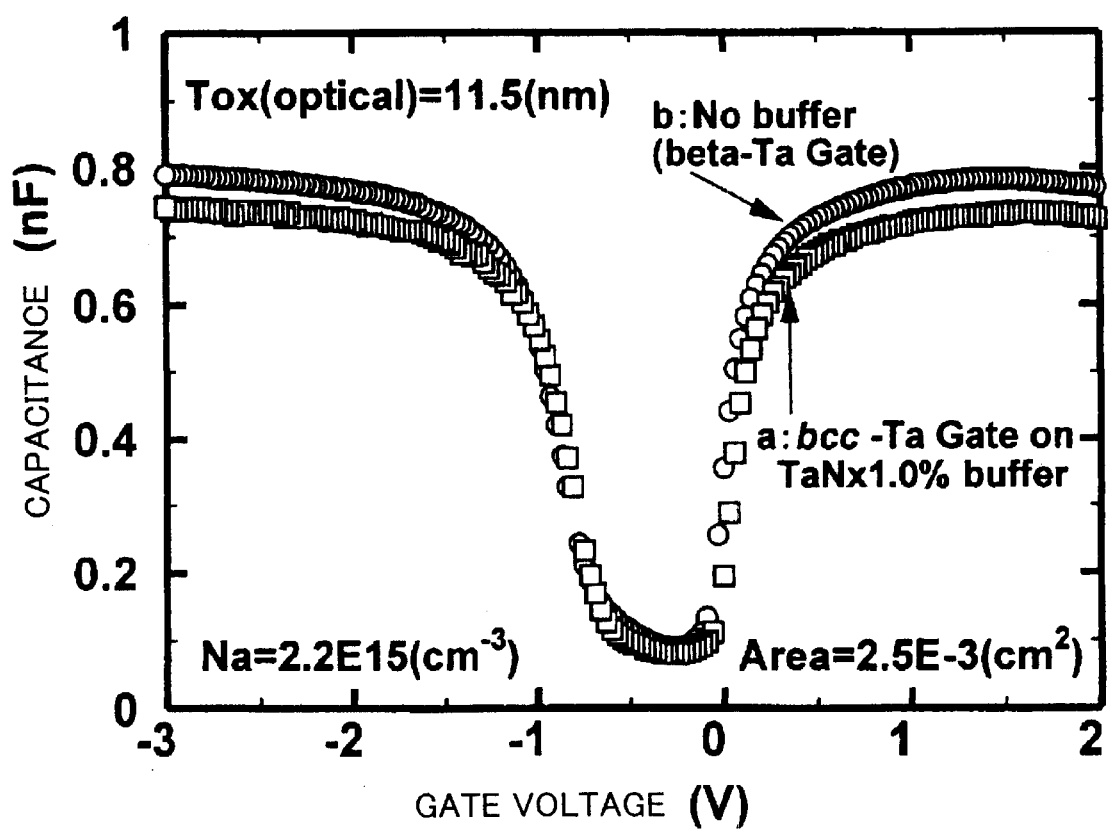
FIG. 8 is a view showing the relation between a gate voltage and capacitance determined for the sample of the present invention and the sample for comparison.

The quasi-static C-V characteristics were determined for the sample of the present invention and the sample for comparison. The results are shown in FIG. 8. In FIG. 8, the horizontal axis shows gate voltage and the vertical axis shows capacitance. In FIG. 8, a line indicated by the symbol "a" shows the results for the sample of the present invention. A line indicated by the symbol "b" shows the results for the sample for comparison.

As is clear from FIG. 8, since the capacitance is approximately symmetrical with respect to the gate voltage "0", depletion does not occur in the gate electrodes of either sample. Secondly, the capacitance of the sample of the present invention is lower than that of the sample for comparison throughout. This indicates that beta-tantalum reacts with the gate insulation layer in the sample for comparison, thereby forming a reaction layer. Therefore, in the sample of the present invention, the gate electrode, in particular, the tantalum nitride layer, exhibits higher chemical stability in comparison with the sample for comparison, thereby preventing the capacitance from increasing.

Figure 9:
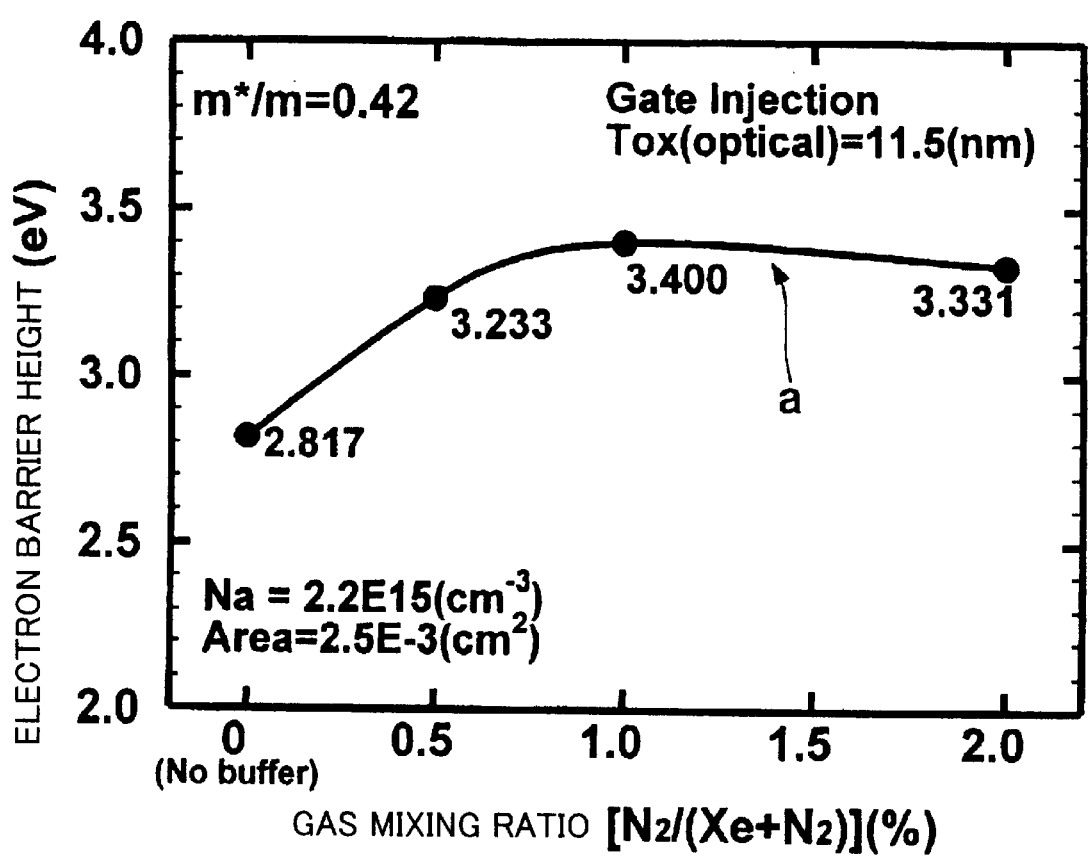
FIG. 9 is a view showing the relation between a gas mixing ratio at the time of depositing a tantalum nitride layer and an electron barrier height between a gate electrode and a gate insulation layer determined for the sample of the present invention and the sample for comparison.

(3) Electron Barrier Height at the Interface Between Gate Electrode (Tantalum Nitride Layer) and Gate Insulation Layer The electron barrier height at the interface between the gate electrode and the gate insulation layer relative to the nitrogen gas mixing ratio (nitrogen/(xenon+nitrogen)) at the time of depositing the tantalum nitride layer of the gate electrode by sputtering was determined. The results are indicated by the symbol "a" in FIG. 9. In FIG. 9, the horizontal axis shows gas mixing ratio and the vertical axis shows electron barrier height.

As shown by the line indicated by the symbol "a" in FIG. 9, the electron barrier height increases as the ratio of nitrogen at the time of sputtering increases. The electron barrier height peaks when the mixing ratio is about 1 vol %. As is clear from the line indicated by the symbol "a", the work function of the tantalum nitride layer increases by increasing the nitrogen gas mixing ratio to at least about 1 vol %.

(4) Gate Length-threshold Voltage Characteristics

Figure 10:
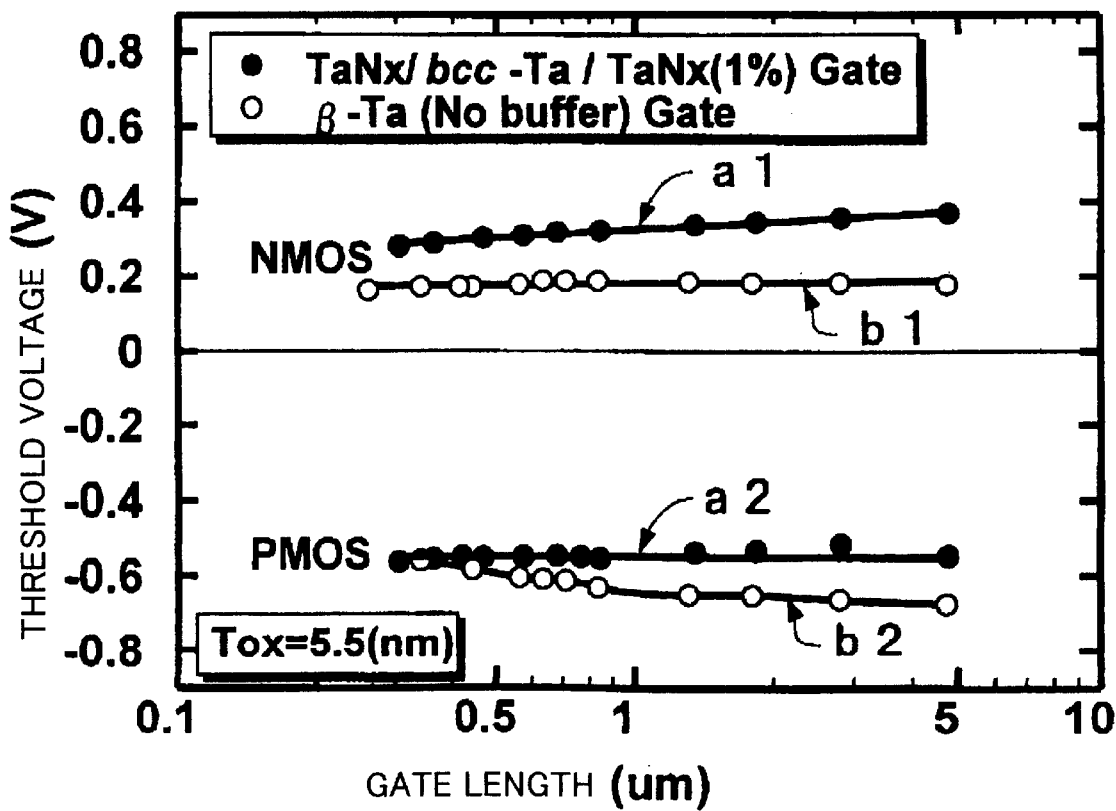
FIG. 10 is a view showing the relation between a gate length and a threshold value determined for the sample of the present invention and the sample for comparison.

Changes in the threshold voltage relative to the gate length were determined for the sample of the present invention and the sample for comparison. The results are shown in FIG. 10. In FIG. 10, the horizontal axis shows gate length and the vertical axis shows threshold voltage. In FIG. 10, the results for the sample of the present invention are indicated by symbols "a1" and "a2". The results for the sample for comparison are indicated by symbols "b1" and "b2". The symbols "a1" and "b1" indicate the results for the NMOSFET, and the symbols "a2" and "b2" indicate the results for the PMOSFET.

As is clear from FIG. 10, in the sample of the present invention, the threshold voltage increases throughout in both the NMOSFET and the PMOSFET in comparison with the sample for comparison, whereby symmetricalness of the threshold voltage is improved. This indicates that the work function of the tantalum nitride layer is closer to the center of the bandgap of silicon in comparison with that of the beta-tantalum layer.

Second Embodiment

Device

A semiconductor device 2000 according to a second embodiment of the present invention and a method of manufacturing the same are described below with reference to FIGS. 11 to 14. The present embodiment differs from the first embodiment in that the cap layer for preventing oxidation of the gate electrode is formed of a silicide layer 15 of an amorphous or polycrystalline silicon layer instead of the tantalum nitride layer. In the semiconductor device 2000, sections substantially the same as those of the semiconductor device 1000 are indicated by the same symbols. Detailed description of these sections is omitted.

In the present embodiment, the gate electrode 3 includes the tantalum nitride layer 4 which is in contact with the gate insulation layer 2, the body-centered cubic tantalum layer 5 or other high-melting-point metal layer, and the silicide layer 15 of an amorphous or polycrystalline silicon layer.

The semiconductor device 2000 of the present embodiment has the following action and effect in addition to those of the semiconductor device 1000 of the first embodiment. Specifically, according to the semiconductor device 2000, conductivity of the gate electrode 3 further increases by forming the cap layer using the silicide layer 15.

Manufacture Method

The method of manufacturing the semiconductor device 2000 is described below with reference to FIGS. 11 to 14.

Figure 11:
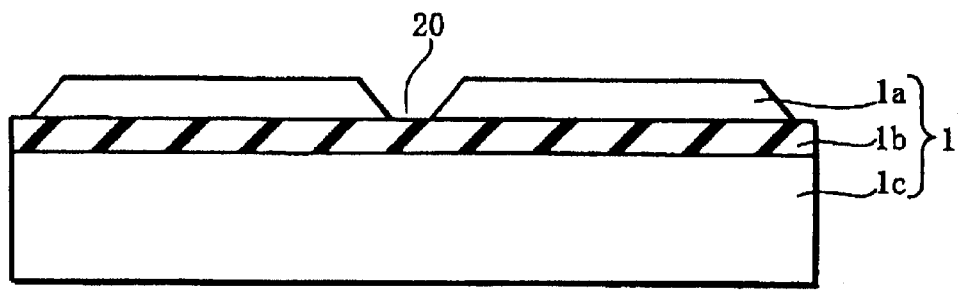
FIG. 11 is a cross-sectional view showing a method of manufacturing a semiconductor device according to a second embodiment of the present invention.

(a) A P-type SOI silicon layer 1a (thickness: 50 nm, specific resistance: 14 to 26 Ω·cm, surface orientation (100)) is patterned, thereby forming the trench 20 for isolating the elements, as shown in FIG. 11.

Figure 12:
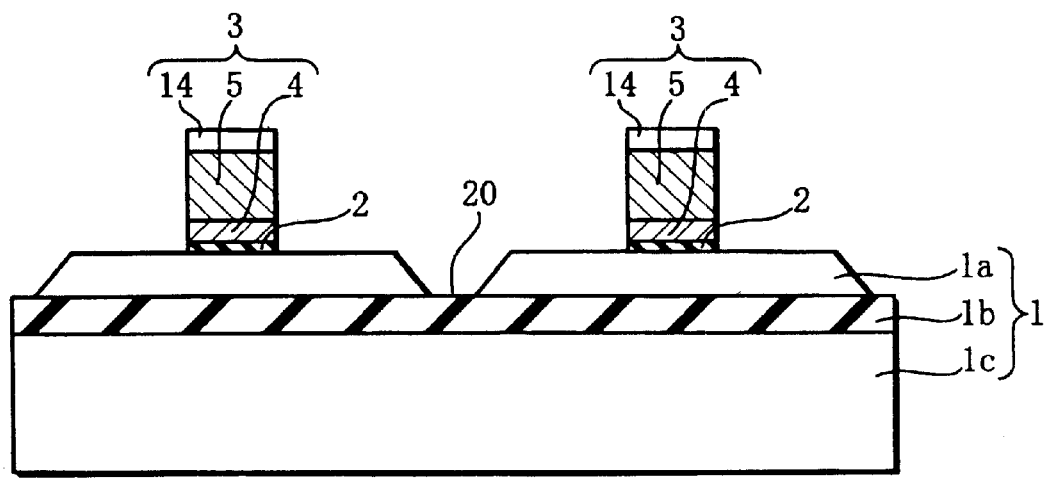
FIG. 12 is a cross-sectional view showing the method of manufacturing a semiconductor device according to the second embodiment of the present invention.

(b) The gate insulation layers 2 formed of a silicon oxide layer with a thickness of about 3 nm are formed using a thermal oxidation process, as shown in FIG. 12.

The tantalum nitride layer 4, the body-centered cubic tantalum layer 5 or other high-melting-point metal layer, and an amorphous or polycrystalline silicon layer 14 are deposited in that order by sputtering using xenon gas.

Sputtering using xenon gas with a mass greater than that of conventionally used argon ensures that energy is applied only to the surface of the layer during deposition without causing defects or damage to occur in the underlying gate insulation layer 2 and the silicon layer 1a in the same manner as in the first embodiment.

The tantalum nitride layer 4, the body-centered cubic tantalum layer 5 or other high-melting-point metal layer, and the amorphous or polycrystalline silicon layer 14 can be formed continuously without allowing these layers to be exposed to air. If the film is exposed to air during deposition, moisture may adhere to the film or oxide may be formed on the surface of the film.

The low-resistance body-centered cubic tantalum layer 5 is heteroepitaxially grown on the tantalum nitride 4 by lattice matching in the same manner as in the first embodiment. The silicon layer 14 in the upper layer is silicided in a process described later, whereby the silicon layer 14 functions as a cap layer for preventing oxidation of the tantalum layer 5 or other high-melting-point metal layer.

The gate electrode is then patterned using a lithographic technique and a dry etching technique.

Figure 13:
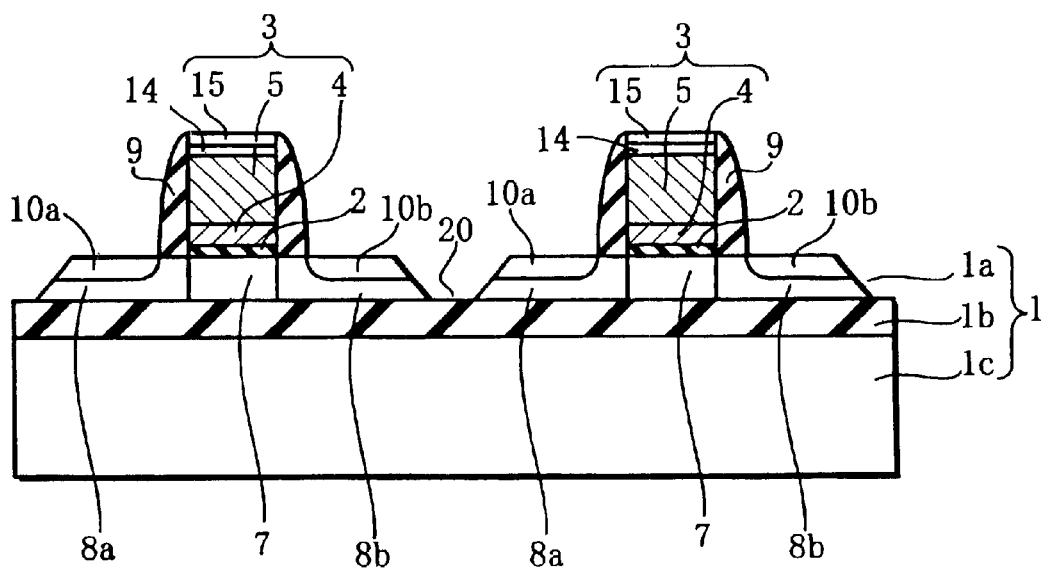
FIG. 13 is a cross-sectional view showing the method of manufacturing a semiconductor device according to the second embodiment of the present invention.
Figure 14:
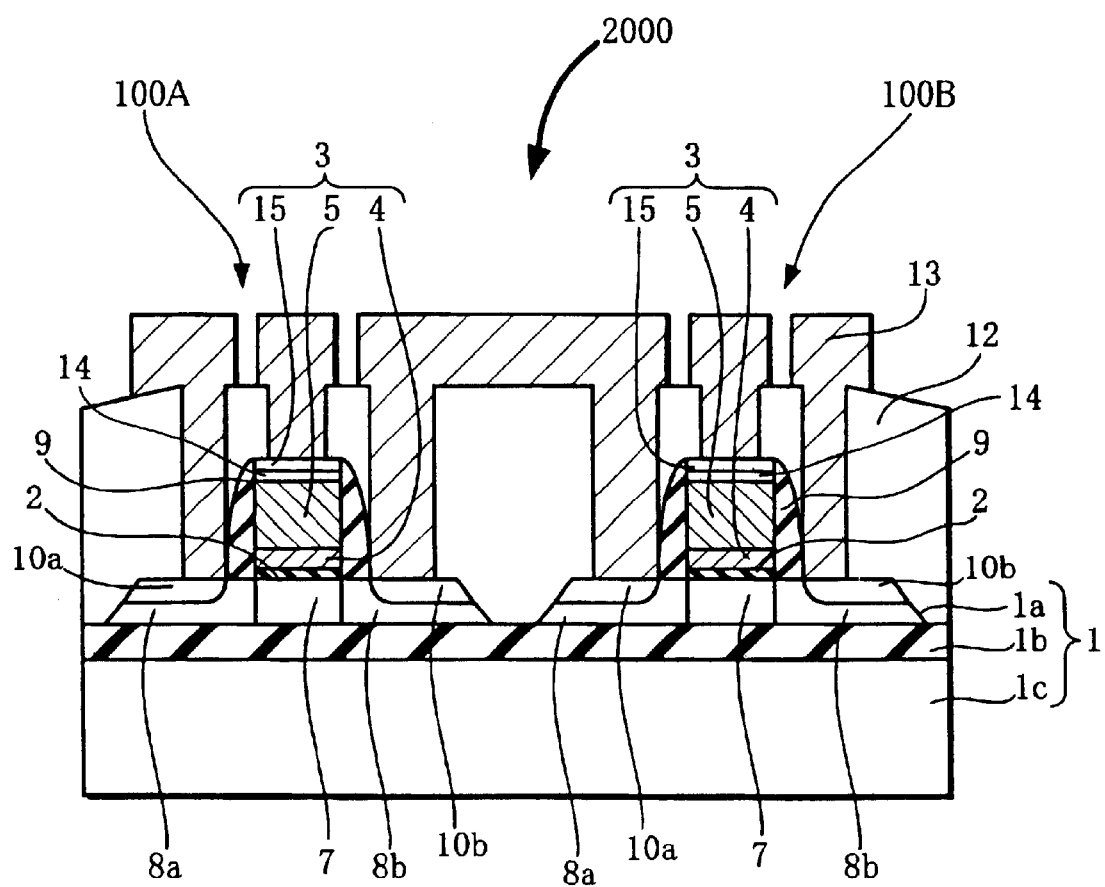
FIG. 14 is a cross-sectional view showing the method of manufacturing a semiconductor device and the semiconductor device according to the second embodiment of the present invention.

(c) An arsenic ion (As$^+$) and a boron difluoride ion (BF$_2^+$) are respectively implanted into the NMOSFET and the PMOSFET at a concentration of $10^{20}$ cm$^{-3}$ or more using the gate electrode 3 as a mask, as shown in FIG. 13. When forming the impurity diffusion layers of the NMOSFET and the PMOSFET, a mask layer (not shown) such as a resist layer is formed in a predetermined region so that an impurity ion with a reversed polarity is not doped.

Impurity diffusion layers 8a and 8b can be formed in a self-alignment manner by low-temperature annealing at 700° C. or less, for example 450° C. to 550° C. Then, a silicon oxide layer is deposited over the entire surface of the SOI substrate 1 on which the gate electrodes 3 are formed using a CVD (Chemical Vapor Deposition) process. The silicon oxide layer is etched back using a dry etching process, thereby forming side-wall spacers 9.

A transition metal layer such as an Ni layer is deposited using a sputtering process and then annealed, thereby forming nickel silicide layers 10a, 10b, and 15 on the exposed area of the impurity diffusion layers 8a and 8b and the silicon layer 14. Unreacted transition metal layers on the side-wall spacers 9 are removed using an acid such as sulfuric acid, thereby forming the silicide layers 10a, 10b, and 15 in a self-alignment manner.

(d) An interlayer dielectric 12 and a wiring layer 13 are then formed by a wiring step using conventional CMOS process technology to obtain the semiconductor device 2000.

The embodiments of the present invention are described above. The present invention may be embodied in various ways within the scope of the present invention. For example, in the above embodiments, the gate electrode has a structure in which the tantalum nitride layer and the tantalum layer or other high-melting-point metal layer are laminated. The gate electrode may have a single layer structure consisting of the tantalum nitride layer instead of having a multilayer structure. The gate insulation film is formed using a thermally oxidized silicon film. Alternatively, a silicon nitride film or the like may be used.

What is claimed is:

1. A semiconductor device comprising:
   first and second impurity diffusion layers forming a source region and a drain region which are formed in a semiconductor layer;
   a channel region formed between the first and second impurity diffusion layers;
   a gate insulation layer formed at least on the channel region; and
   a gate electrode formed on the gate insulation layer,
   wherein the gate electrode includes a tantalum nitride layer formed in a region in contact with at least the gate insulation layer and a body-centered cubic tantalum layer heteroepitaxially formed over the tantalum nitride layer,
   wherein a nitrogen/tantalum ratio (x) as shown by TaN$_x$ in the tantalum nitride layer is 0.25 to 1.0.

2. The semiconductor device according to claim 1,
   wherein the nitrogen/tantalum ratio (x) shown by TaN$_x$ in the tantalum nitride layer is approximately 0.5.

3. The semiconductor device according to claim 1,
   wherein the tantalum nitride layer has a thickness of 1 nm to 300 nm.

4. The semiconductor device according to claim 1,
   wherein the gate electrode further comprises a cap layer formed on the uppermost layer.

5. The semiconductor device according to claim 4,
   wherein the cap layer is formed of at least one material selected from TaN$_x$, TaSi$_x$N$_y$, TiN$_x$, TiAl$_x$N$_y$, Si, and silicide of a transition metal.

6. The semiconductor device according to claim 5, wherein the cap layer is formed of the tantalum nitride layer.

7. The semiconductor device according to claim 1,
   wherein suicide layers are formed on part of the first and second impurity diffusion layers.

8. The semiconductor device according to claim 1,
wherein the semiconductor layer has a silicon on insulator (SOI) structure or a silicon on nothing (SON) structure.

9. A complementary semiconductor device comprising an N-channel insulated gate field effect transistor and a P-channel insulated gate field effect transistor,
wherein each of the N-channel insulated gate field effect transistor and the P-channel insulated gate field effect transistor comprises:
first and second impurity diffusion layers forming a source region and a drain region which are formed in a semiconductor layer;
a channel region formed between the first and second impurity diffusion layers;
a gate insulation layer formed on the channel region; and
a gate electrode formed on the gate insulation layer,
wherein the gate electrode includes a tantalum nitride layer formed in a region in contact with at least the gate insulation layer and a body-centered cubic tantalum layer heteroepitaxially formed over the tantalum nitride layer,
wherein a nitrogen / tantalum ratio (x) as shown by $TaN_x$ in the tantalum nitride layer is 0.25 to 1.0.

10. The complementary semiconductor device according to claim 9,
wherein the nitrogen/tantalum ratio (x) shown by $TaN_x$ in the tantalum nitride layer is approximately 0.5.

11. The complementary semiconductor device according to claim 9,
wherein the tantalum nitride layer has a thickness of 1 nm to 300 nm.

12. The complementary semiconductor device according to claim 9,
wherein the gate electrode further comprises a cap layer formed on the uppermost layer.

13. The complementary semiconductor device according to claim 12,
wherein the cap layer is formed of at least one material selected from $TaN_x$, $TaSi_xN_y$, $TiN_x$, $TiAl_xN_y$, Si, and silicide of a transition metal.

14. The complementary semiconductor device according to claim 13, wherein the cap layer is formed of the tantalum nitride layer.

15. The complementary semiconductor device according to claim 9,
wherein silicide layers are formed on part of the first and second impurity diffusion layers.

16. The complementary semiconductor device according to claim 9,
wherein the semiconductor layer has a silicon on insulator (SOI) structure or a silicon on nothing (SON) structure.

* * * * *